United States Patent [19]

Gomperts et al.

[11] 4,101,829
[45] Jul. 18, 1978

[54] DIFFERENTIAL CURRENT DETECTOR

[75] Inventors: Robert J. Gomperts, Herentals; Gerard M. V. Driesen, Borgerhout, both of Belgium

[73] Assignee: GTE International, Inc., Stamford, Conn.

[21] Appl. No.: 787,291

[22] Filed: Apr. 13, 1977

[30] Foreign Application Priority Data

Jul. 7, 1976 [BE] Belgium .................................. 843853

[51] Int. Cl.² ...................... G01R 19/10; G01R 33/00; H01H 47/32
[52] U.S. Cl. .................................. 324/126; 324/117 R; 324/133; 335/204; 340/664; 361/187; 361/210
[58] Field of Search .................... 324/126, 127, 117 R, 324/117 H, 140 D, 140 R, 133; 340/253 C, 253 H, 253 N; 335/204, 266, 268; 361/210, 187

[56] References Cited

U.S. PATENT DOCUMENTS

| 698,686 | 4/1902 | Duncan | 324/127 |
| 2,995,637 | 8/1961 | Feiner et al. | 335/182 |
| 3,134,055 | 5/1964 | Cronier et al. | 361/210 |
| 3,134,908 | 5/1964 | Ellwood | 361/210 |

Primary Examiner—Rudolph V. Rolinec
Assistant Examiner—Ernest F. Karlsen
Attorney, Agent, or Firm—Douglas M. Gilbert

[57] ABSTRACT

In a power distribution system having a first conductor carrying a current $I_1$ and a second conductor carrying a current $I_2$, in the same direction as $I_1$, a differential current detector sensing when $|I_1 - I_2|$ exceeds a predetermined level, $I_3$. The detector comprises a ferromagnetic yoke having first and second parallel bores accommodating the first and second conductors respectively. The first and second bores are interconnected by a coplanar slot in the yoke which extends transversely therebetween. The yoke further includes a third bore disposed between the first and second bores and orthogonal thereto. A reed capsule switch having two mutually exclusive conductive states extends through the third bore and is responsive to the flux generated by the currents $I_1$ and $I_2$, such that when $|I_1 - I_2| \leq I_3$ the reed switch exhibits one conductive state and when $|I_1 - I_2| > I_3$ the reed switch exhibits a second conductive state.

5 Claims, 4 Drawing Figures

DIFFERENTIAL CURRENT DETECTOR

BACKGROUND OF THE INVENTION

This invention relates to current measuring apparatus which detects when the difference in direct current in two electrical conductors exceeds a predetermined level.

It is often desirable to determine when a change in current occurs in a pair of electrical conductors connected to a common power source such as a battery. For example, in a power distribution system, the current in one conductor might decrease from 20A (amperes) to 15A and the current in another conductor pair might have a corresponding increase. Such changes could signify a variety of possible circuit failures, such as a shorted steering diode in one of the conductors. Various sensing devices, usually voltage sensitive, have been built to determine when current changes of this type occur. Besides voltage sensitive devices, differential relays have been built and are very useful in determining current changes in a pair of conductors. Unfortunately, such relays are designed for relatively low current levels (i.e., small signal applications). Particularly for currents in the 20A to 50A region such devices are completely useless. The basic reason differential relays are not made to operate at high current levels is that the large conductor size precludes winding onto a common coil form. Certainly there are techniques available which could be used to reliably make such measurements in this high current region, however, they employ sophisticated and rather expensive apparatus.

It is an object of this invention to provide a reliable and inexpensive differential current detector.

SUMMARY OF THE INVENTION

The differential current detector disclosed herein senses the instant at which the difference in current in two electrical conductors, $|I_1-I_2|$ exceeds some predetermined level, $I_3$. To measure the difference in currents, a ferromagnetic yoke is employed to contain the magnetic fields which surround the current carrying conductors. The yoke has two bores for containing a segment of the two conductors. These bores are connected by a coplanar slot in the yoke which extends transversely therebetween. A third bore in this yoke located between the other two bores, is positioned so that the lines of magnetic flux generated by $I_1$ and $I_2$ are substantially parallel to the third bore. A reed capsule switch having two mutually exclusive conductive states extends through the third bore. This switch is responsive to the magnetic flux generated by $I_1$ and $I_2$ such that when $|I_1-I_2| \leq I_3$ the switch exhibits one conductive state, and when $|I_1-I_2| > I_3$ the switch exhibits a second conductive state.

This invention further relates to a method of measuring changes in the differential current in a pair of electrical conductors employing the apparatus which is also the subject of this invention.

DETAILED DESCRIPTION OF THE PREFERRED EMBODIMENT

Figure 1:
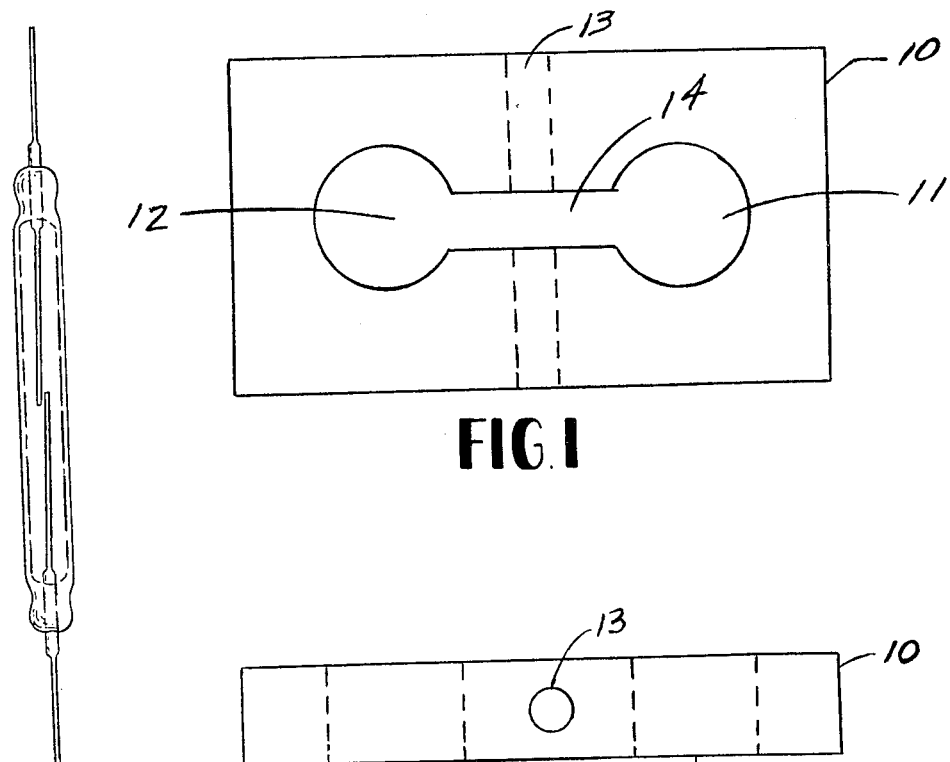
FIG. 1 is a front view of a ferromagnetic yoke used herein.
Figures 2, 3:
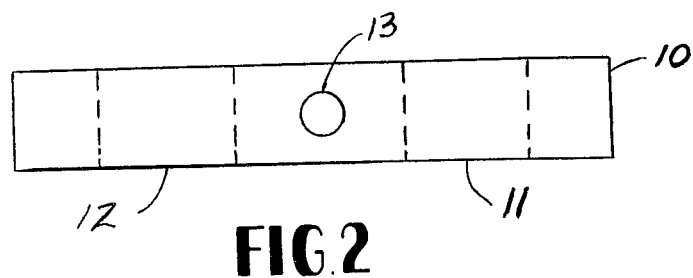
FIG. 2 is a top view of this same ferromagnetic yoke.
FIG. 3 is a cutaway view of a reed capsule switch.

FIG. 1 shows the front view of a structure generally referred to herein as a ferromagnetic yoke, and FIG. 2 shows the top view of this same yoke. The body of the yoke 10 is preferrably of ferromagnetic material such as iron. Two parallel bores (cylindrical cavities) extending through the yoke, 11 and 12, hold a segment of the electrical conductors whose direct current is sought to be measured. These two conductors are not shown for purposes of clarity. The size and shape of these bores are adapted so that the conductors and the yoke are a close fit. Bores 11 and 12 are shown cylindrically since most conductors are round. Any significant gap between the insulator around the conductors and the yoke surface could adversely affect the performance of the device as a conduit of the magnetic flux generated by the currents. With the conductors properly placed in the yoke, and currents of $I_1$ and $I_2$ flowing in the same direction, through the conductors, the magnetic flux generated around the conductors would be substantially captured by the yoke material. A slot 14, connects the two bores 11 and 12 together and extends the entire thickness of the yoke body. The purpose of this slot or air gap is to increase the reluctance R in the area between the two current conductors. (The slot should be sufficiently wide so that the reluctance of the gap is much greater than the reluctance of the reed switch).

A third bore 13 in the yoke material extends from the top of the yoke through the slot and to the bottom of the yoke. The reed capsule switch, shown in FIG. 3, extends through hole 13 when the detector is in operation. Such a switch device comprises a pair of ferrite reeds 20 and 21 acting as the switch contacts which make and break in response to the externally applied magnetic field. The ferrite reeds are incapsulated usually in a gas filled glass capsule 20. Due to the position of hole 13, the magnetic field "flowing" in the yoke is parallel to the ferrite reeds, 21 and 22. From this physical description of the structure the method of operation can now be described.

Figure 4:
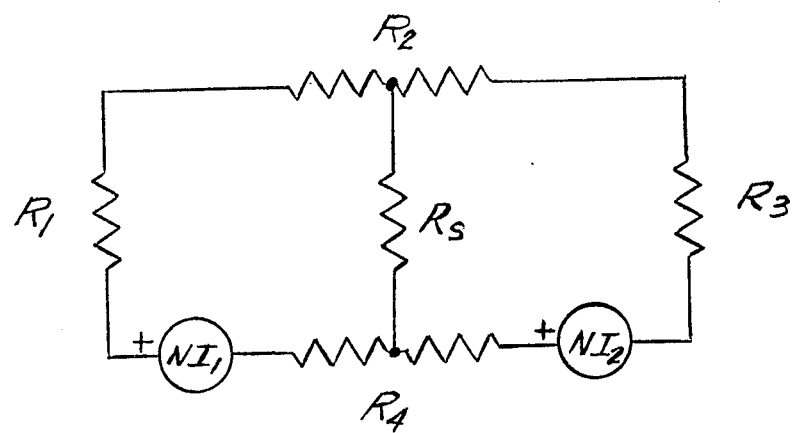
FIG. 4 schematically shows an equivalent magnetic circuit diagram of the preferred embodiment of this invention.

The schematic diagram of the magnetic circuit comprising the apparatus in FIGS. 1, 2 and 3 is shown in FIG. 4. When the two conductors placed in bores 11 and 12 are carrying a direct current, $I_1$ and $I_2$, the equivalent magnetomotive force generated by these two conductors is equal to $NI_1$ and $NI_2$ ampere-turns (N being equal to 1 since there is only one turn through the magnetic material). The various reluctances offered by the various sections of the yoke are represented by $R_1$, $R_2$, $R_3$ and $R_4$. The reluctance $R_s$ represents the reluctance of the reed capsule switch. Referring to FIG. 1 again and assuming that the two conductors have a current flow in the same direction, into the surface of the paper, then the polarity of the two flux generators would be as shown in FIG. 4. With this polarity, the flux generated by the two currents would oppose each other in the center reluctance $R_s$. The reluctance of the yoke in the center region is not shown in FIG. 4 since $R_s$ is much less than the reluctance across the slot 14. $R_1=R_2$ and $R_2=R_4$ (in a homogeneous material and with a symmetrical structure as shown in FIGS. 1 and 2) and therefore, the resultant flux through $R_s$ is zero when $I_1$ equals $I_2$. Under these conditions, the resultant force on the reeds 21 and 22 is zero, and the contacts remain open. A change of current in either $I_1$ or $I_2$ upsets this balanced condition causing a resultant flux to flow through the reed capsule switch. This in turn induces unlike magnetic poles at the overlapping ends of the reeds, and the reeds are mutually attracted. If the remanent flux is sufficient to overcome the spring force of the reeds, the reeds close and thereby establish a direct electrical connection at the terminals connected to the reeds. And removal of the flux in $R_s$ causes the contacts to open. The precise point at which the contacts will close can be controlled by selection of a particular reed capsule switch having an appropriate ampere-turn rating. Since the rectangular ferrite-hysteresis loop is symmetric a resultant flux in either direction will cause a closure of the switch contacts.

To detect a change in the conductance state of the reed switch, most any device which could measure a change of impedance would be suitable. A simple battery with an alarm lamp in series could, for example be used to signal the change in state of the reed switch.

By studying FIG. 4, it can be seen that moving $R_s$ closer to the $NI_1$ loop or the $NI_2$ loop will create a greater total reluctance path in one loop or the other. Physically this can be done by moving the hole 13 closer to either hole 12 or hole 11. Such a "magnetic bias" would be desirable if either $I_1$ or $I_2$ was normally greater than the other, for example, the normal condition might be $I_1 = 20A$ and $I_2 = 30A$.

The magnetic yoke structure can also be adapted for use with a plurality of electrical conductors. If it is desired that a balance between a group of conductors be maintained, then $I_1$ could represent the sum of currents in two or more electrical conductors. Similarly $I_2$ could represent the sum of currents in two or more electrical conductors. The structure shown in FIGS. 1 and 2 could then be modified so that bores 11 and 12 permit the insertion of such plurality of conductor means. It is desirable, to maintain a fairly close fit between the body of the ferromagnetic yoke 10 and the electrical conductors, since a significant gap could adversely affect the flux linkage in the yoke structure.

What is claimed is:

1. In a power distribution system having a first electric conductor means for conducting a direct current $I_1$ and a second electric conductor means for conducting a direct current $I_2$ in the same direction as $I_1$, a differential current detector determining when $|I_1 - I_2|$ exceeds a predetermined level, said detector comprising:
   a ferromagnetic body having first and second parallel bores for accommodating said first and second conductor means, said first and second bores being interconnected by a coplanar slot extending transversely therebetween, said body further having a third bore orthogonal to the first and second bores and extending through said slot; and
   a reed capsule switch disposed through said third bore, having two mutually exclusive conductive states, and responsive to the magnetic flux generated by the current in said first and second conductors, whereby when $|I_1 - I_2| \leq$ a predetermined magnitude $I_3$ said switch exhibits one conductive state and when $|I_1 - I_2| \leq I_3$ said reed switch exhibits a second conductive state.

2. A differential current detector for determining when the magnitude of the difference in direct currents in first and second conductor means exceeds a predetermined current level, said detector comprising:
   first electric conductor means for conducting a direct current $I_1$;
   second electric conductor means for conducting a direct current $I_2$, in the same direction as $I_1$;
   a ferromagnetic yoke having first and second parallel bores closely accommodating first and second conductors, said bores being connected by a coplanar slot extending transversely therebetween, said yoke also having a third bore located between said first and second bores and at right angles thereto so that the lines of the flux generally by $I_1$ and $I_2$ are superimposed and parallel to said third bore; and
   a reed capsule switch, having two mutually exclusive conductive states, and disposed through said third bore, said switch being responsive to the magnetic flux generated by $I_1$ and $I_2$, and exhibiting one conductive state when $|I_1 - I_2| \leq$ a predetermined current $I_3$, and exhibiting a second conductive state when $|I_1 - I_2| > I_3$.

3. A detector as in claim 2 further comprising measuring apparatus electrically coupled to said reed switch for determining the instant at which said switch changes from one state to the other.

4. A detector as in claim 3 wherein the ferromagnetic material is iron.

5. A method of measuring the differential current between two direct current carrying conductors, which comprises:
   inserting first and second conductors, carrying direct current $I_1$ and $I_2$ respectively, into a bar of ferromagnetic material having first and second bores adapted to receive said conductors, such that $I_1$ and $I_2$ flow in the same direction, said holes being joined by a coplanar slot extending transversely therebetween said bar also having a third bore whose center line is orthogonal to a plane containing said first and second, said bore extending through said slot;
   placing into said third bore a reed capsule switch having two mutually exclusive conductive states, said switch being responsive to the flux generated by $I_1$ and $I_2$ in said first and second conductors;
   measuring the conductive state of said reed capsule switch; and
   detecting a change in state in said switch at the instant $|I_1 - I_2|$ exceeds a predetermined current level.

* * * * *